United States Patent [19]

Houser et al.

[11] 4,415,113

[45] Nov. 15, 1983

[54] IMPACT PINNER APPARATUS

[75] Inventors: David E. Houser, Apalachin; Harold Kohn, Endwell; Gordon L. Williams, Endicott, all of N.Y.

[73] Assignee: International Business Machines Corporation, Armonk, N.Y.

[21] Appl. No.: 223,191

[22] Filed: Jan. 7, 1981

[51] Int. Cl.³ ............................................. B27F 7/00
[52] U.S. Cl. ..................................... 227/130; 91/469; 91/DIG. 4; 227/156
[58] Field of Search ................... 91/275, 469, DIG. 4; 227/130, 2, 107, 147, 156; 123/188 B, 190 HC

[56] References Cited

U.S. PATENT DOCUMENTS

| 10,290 | 2/1883 | Parker | 123/188 B |
|---|---|---|---|
| 2,975,119 | 3/1961 | Emmons | 91/DIG. 4 |
| 3,216,328 | 11/1965 | Peterson | 91/DIG. 4 |
| 3,434,393 | 3/1969 | Cairatti | 91/469 X |
| 3,583,496 | 6/1971 | Fehrs | 227/130 X |
| 3,584,776 | 6/1971 | Bolte | 227/130 |
| 3,708,877 | 1/1973 | Digirolamo et al. | 29/628 |
| 4,176,586 | 12/1979 | Stoll et al. | 91/DIG. 4 |

FOREIGN PATENT DOCUMENTS 891180 1/1972 Canada .
2426181 1/1976 Fed. Rep. of Germany ... 91/DIG. 4

OTHER PUBLICATIONS

IBM Technical Disclosure Bulletin, vol. 9, No. 4, Sep. 1966; Byrnes, *Terminal Pin Projector.*

*Primary Examiner*—Paul A. Bell
*Attorney, Agent, or Firm*—Norman R. Bardales

[57] ABSTRACT

Multiple pins are affixed in the holes of a ceramic substrate by simultaneously impacting the pins with a piston assembly which temporarily places the pins in a viscoelastic fluid state. Upon return of the pins and the resultant fluid flow to its undisturbed solid state, each pin is left with an extension that is in interlocking engaged relationship with the ceramic particles of the substrate in the region surrounding the particular holes in which the pins have been located.

The piston assembly is driven by a pneumatic high pressure system which is adjustable to the number of pins being simultaneously impacted. Release of the piston assembly is delayed until the air pressure becomes stabilized prior to impact. A vacuum pressure system returns the piston to its originating position after impact whereupon the piston assembly is ready for the next impact cycle.

4 Claims, 2 Drawing Figures

IMPACT PINNER APPARATUS

CROSS-REFERENCE TO OTHER APPLICATION

In co-pending patent application, Ser. No. 223,190 filed concurrently herewith, entitled "Pinned Substrate Apparatus," D. E. Houser, co-inventor herein, now abandoned, and in the continuation application, Ser. No. 458,375, filed Jan. 17, 1983 for the aforementioned now abandoned parent application, Ser. No. 223,190, there is described a pinned ceramic substrate which can be made with the machine apparatus of the present application.

BACKGROUND OF THE INVENTION

1. Field of the Invention

This invention relates to pinner apparatus and more particularly to impact pinner apparatus for pinning ceramic substrates.

2. Description of the Prior Art

In the aforementioned co-pending application, there is described a machine apparatus for pinning a ceramic substrate. The machine apparatus thereof used a rod-like hammer which was driven by an elastic band to impact a single pin P to be affixed within the preformed hole of a ceramic substrate. Because the hammer and pin to be pinned required substantially co-axial alignment, the machine apparatus thereof was not satisfactory for pinning more than one pin at a time to the substrate. As a consequence, in the case of a substrate having multiple preformed holes and corresponding multiple pins to be affixed therein, the pinning operation of the machine apparatus thereof had to be done one at a time, i.e., serially, with a concomitant increase in time and/or risk of damage to the substrate. Moreover, if the pins had close axial spacing, less than the diameter of the hammer, the machine apparatus thereof was ineffectual to cause the pins, which happened to be impacted at the same time by the hammer, to be placed in the required viscoelastic fluid state as described therein and explained hereafter which would subsequently render their affixation to the substrate. For these and other reasons as will become apparent hereinafter, the machine apparatus thereof was not satisfactory for pinning multiple pins to a ceramic substrate.

SUMMARY OF THE INVENTION

It is an object of this invention to provide machine apparatus that uses an impact force for pinning ceramic substrates with multiple pins.

It is still another object of this invention to provide machine apparatus of the aforementioned kind in which the impact force results in affixing each pin by an extension thereof formed in response to said force which is in interlocking engaged relationship with the ceramic particles in the region of the ceramic substrate surrounding the hole in which the pin is located.

Still another object of this invention is to provide machine apparatus of the aforementioned kind which is fast, reliable and/or provides a high yield of pinned substrates with multiple pins.

According to one aspect of the invention, there is provided machine apparatus for pinning plural metallic pins to a cured substrate of ceramic particles, the pins being located in respective preformed openings of the substrate prior to being pinned thereto. The apparatus has tube-like chamber means with piston means slidably operable therein in first and second opposite directions. Pneumatic first means drives the piston means in the first direction within the chamber means and away from a predetermined first position. The piston means simultaneously impacts the plural pins at a predetermined second position when being driven in the first direction. Pneumatic second means returns the piston means in the second direction within the chamber means away from the second position and to the first position. Selective valve means selectively interconnects the first and second pneumatic member means to the chamber means. Air bearing means support the piston means relative to the chamber means at least during the movement of the piston means within the chamber means between the first and second positions. The piston means simultaneously impacts the pins with a predetermined impact force that places the pins in a temporary viscoelastic fluid state causing each of the pins to flow between the particles of the substrate in the region surrounding the particular hole in which each pin is located. The fluid flow forms an integral extension in each of the pins in interlocking engaged relationship with the ceramic particles of the substrate in the region surrounding the particular hole in which each pin is located upon return of each pin and the fluid flow to its undisturbed solid state.

The foregoing and other objects, features and advantages of the invention will be apparent from the more particular description of a preferred embodiment of the invention, as illustrated in the accompanying drawing.

BRIEF DESCRIPTION OF THE DRAWING

In the figures, like elements are designated with similar reference numbers.

DESCRIPTION OF THE PREFERRED EMBODIMENT

Figure 1:
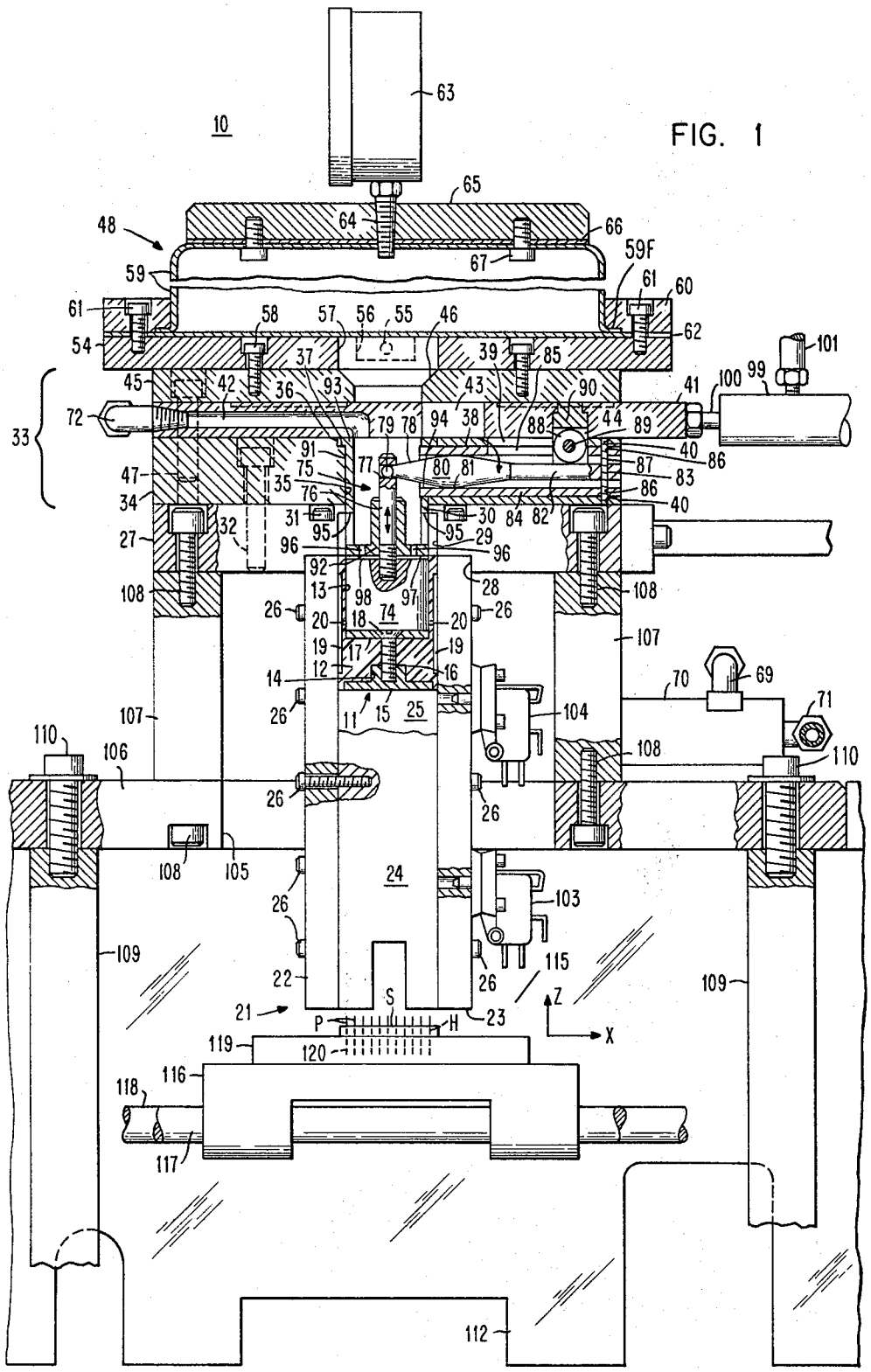
FIG. 1 is a side elevation cross-sectional view of a preferred embodiment of the machine apparatus of the present invention taken substantially along the line 1—1 of FIG. 2.
Figure 2:
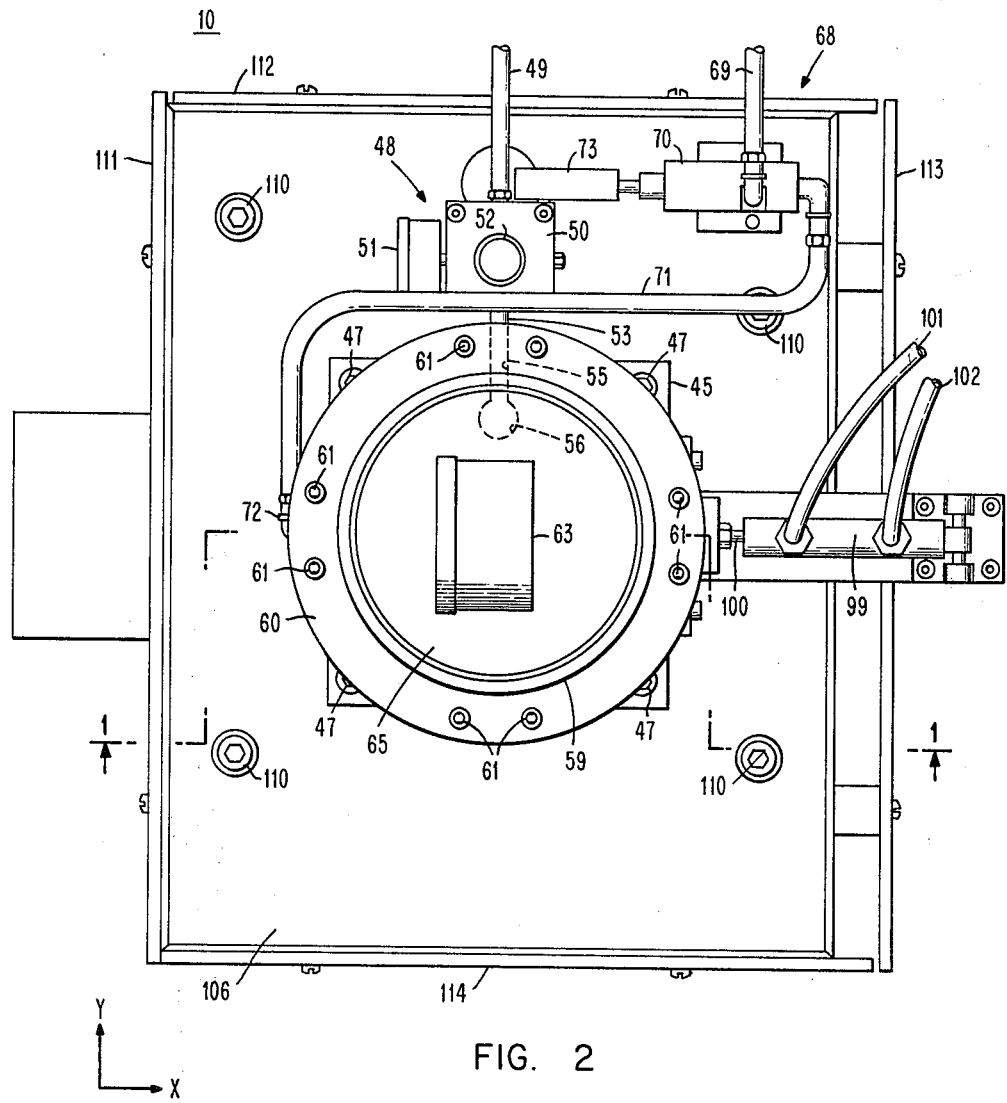
FIG. 2 is a top plan view of the machine apparatus of FIG. 1.

Referring to FIGS. 1 and 2, there is shown the machine apparatus 10 of the preferred embodiment of the present invention. Apparatus 10 is used to affix simultaneously metallic, e.g. copper, plural pins P to a planar substrate S comprised of ceramic particles. It does this using the inventive principles of the aforementioned co-pending application, Ser. No. 223,190, incorporated herein by reference. As described therein, it has been found that impacting a metallic member placed in the hole or opening of a ceramic member with a force sufficient to place the metallic member in a temporary viscoelastic fluid state, a resultant metal flow takes place that penetrates between the ceramic particles in the region of the substrate surrounding the hole. As a result, when the metallic member and flow returns to its undisturbed solid state, the flow remains entrapped between the particles and integrally connected to the main core of the metallic member. Thus, an extension of the metallic member is produced by the flow which upon solidification is in interlocking engaged relationship with the ceramic particles thereby effecting the affixation of the metallic member to the substrate within the hole. For further details and information, references should be made to the aforementioned co-pending application.

Apparatus 10 has a piston assembly generally indicated by the reference number 11. In particular, assembly 11 includes a piston 12. Piston 12 is a machined part preferably made of a polyimide resin known as Vespel (Registered Tradename of E. I. DuPont de Nemours Company) because of inter alia its superior mechanical strength and wear resistance properties. The piston 12, which has a square cross-sectional outer configuration, also has a concentric square cross-sectional cavity 13 or opening formed inwardly from the top end of piston 12. Another concentric cavity or opening 14, which is formed inwardly from the bottom end of piston 12, and having a compatible contour concentrically houses a square metal, e.g., steel, impact plate member 15 and its integral center located cylindrical collar 16. The member 15 is flush mounted with, or slightly protrudes outwardly from, the bottom of piston 12. A magnetic, e.g. steel, disc shaped member 17 is housed at the bottom of upper cavity 13. Members 15 and 17 are secured to piston 12 by a flat machine screw 18 which threadably engages the collar 16 after passing through the aligned countersunk bore of member 17 and aligned center bore of piston 12. The head of flat screw 18 is flush mounted with or is slightly below the upper surface of disc member 17 when threadably engaged in collar 16.

Also, formed on the respective outer faces of the four longitudinal sides of piston 12 are parallel elongated identical air-bearing channels 19 only two of which are viewable in FIG. 1. It should be understood that each outer face of the four longitudinal, i.e. vertical, sides of piston 12 has the same number of parallel channels 19 and which in the preferred embodiment is two channels 19. Thus, a total of eight channels 19 are symmetrically disposed around the four outer sides of piston 12. Each channel 19 has a small diameter bleeder hole 20 in communication with the cavity 13.

The piston assembly 11 slidably operates in a bi-directional manner within an elongated piston chamber assembly generally indicated by the reference number 21. The tube-like assembly 21 has inner and outer concentric square shaped cross-sectional configurations formed by the assembly of four equal length rectangular plate member 22–25. Members 22–25 are fastened together by machine bolts 26 which pass through opposite plate members 22, 23 and threadably engage the other two plate members 24, 25 as shown in FIG. 1. For sake of clarity and/or explanation, in FIG. 1 the plate members 22, 23 and 24 are shown in partial cross-section and furthermore front plate member 24 is partially broken away in FIG. 1 to allow a partial viewing of inside the chamber 21 and of the inner face of opposite rear plate member 25.

The upper end of the piston chamber assembly 21 is affixed to a base plate member 27. More particularly, the upper end of assembly 21 fits into a compatibly contoured, i.e., square shaped, bottom, recess 28 formed in the member 27. Concentrically aligned with recess 28 in member 27 are cylindrical shaped intermediate recess 29 and smaller diameter cylindrical shaped top recess 30. Assembly 21 is affixed to member 27 by eight machine bolts, each of which is threadably engageable through the upper edge of one of the plate members 22–25, cf., for example, bolts 31 and members 22, 23.

Mounted on top of the base plate member 27 by an appropriate number of machine bolts 32, only one of which is shown in FIG. 1, is a shuttle valve assembly generally indicated by the reference numeral 33. Shuttle valve assembly 33 includes a lower stationary plate member 34 having bottom and top concentric cylindrical recesses or bores 35, and 36, respectively, in concentric alignment with the recesses of 28, 29, 30 of member 27. Recess 35 has a diameter substantially equal to the diameter of recess 30; whereas the diameter of recess 36 is slightly larger and forms a circumferential shoulder 37.

Extending horizontally from the right side of member 34 as viewed facing FIG. 1 and passing therethrough to the recess 35 is a cylindrical bore 38. A horizontal recess or slot 39 in alignment with bore 38 passes from the top of member 34 through to the bore 38, and also a pair of aligned pin holes 40 pass from the respective top to bottom of member 34 and through the bore 38.

The valve assembly 33 has an intermediate horizontally slidable slide plate member 41 with two spaced valve ports 42, 43. Port 42 is comprised of a horizontal small diameter elongated bore and an intersecting vertical bore of substantially equal diameter. The horizontal bore extends from the left edge, as viewed facing FIG. 1, through to the intersecting vertical bore which originates from the bottom of member 41. The other port 43 is a cylindrical bore which extends vertically from the top on through to the bottom of member 41. An inverted T-shaped opening 44 is also provided in member 41 as explained hereinafter.

Top stationary plate member 45 of shuttle valve assembly 33 has a funnel shaped bore 46, the lower end of bore 46 having a diameter compatible with the diameter of port 43 of member 41. The members 34, 41 and 45 of assembly 33 are securely held together by an appropriate number of machine bolts, e.g., bolt 47, the heads of which are recessed in top member 45 and the ends of which are threadably engageable with the bottom member 34.

Piston assembly 11 is pneumatically driven in the downward direction in the chamber assembly 21 using an adjustable high pressure air system, generally indicated by the reference number 48. A flexible tubing or hose 49, FIG. 2, interconnects an air pressure supply, not shown, to an adjustable pressure regulator 50 having a course dial indicator 51 operatively connected thereto and a manual adjustment control 52. The regulator 50 is connected by a connector 53 to a base plate member 54 which has a horizontal bore 55 which is in threadable engagement with the connector 53. A vertical bore 56, which extends upwardly through and to the top of plate member 54, intersects bore 55. Intersecting bores 55–56 are spaced from a central vertical cylindrical bore 57 of member 54. The diameter of bore 57 is substantially equal to the diameter of the mouth of the funnel-shaped bore 46 of member 45, the two bores 46, 57 being in substantial concentric vertical alignment. Plate member 54 is affixed to member 45 by an appropriate number of machine bolts 58, only two of which are viewable in FIG. 2, that are in threaded engagement with the member 45.

The air from regulator 50 is fed via members 53–56 to an accumulator 59. The later is mounted atop the member 54 by its flange 59F which is clamped between a compatibly contoured collar ring 60 and the member 54 using the machine bolts 61 which threadably engage member 54 after passing through the sealing ring gasket 62. Operatively connected to the accumulator 59 is a precision indicator 63 via its fitting 64. A mounting plate member 65 is threadably engageable with the fitting 64 passing therethrough, member 65 being mounted to the accumulator 59 through a sealing gasket 66 by an appropriate member of machine bolts 67, only two of which are viewable in FIG. 2, and which are in threaded engagement with member 65. Accumulator 59 is operatively connected to the piston assembly 11 through port 43, hereinafter sometimes referred to as the pressure port, of the slide plate member 41 of valve assembly 33 as explained in greater detail hereinafter.

The piston assembly 11 is lifted in the upward direction in the piston chamber assembly 21 with a vacuum pressure system generally indicated by the reference number 68. Flexible tubing or hose 69, FIG. 2 is connected to an air pressure supply, not shown, and supplies air to a vacuum transducer 70. As a result, a vacuum is provided in flexible tubing or hose 71 which is connected via fitting 72 to the other port 42, hereinafter sometimes referred to as the vacuum port, of slide plate member 41. The air from line 69 after passing through transducer 70 is connected to a muffler 73. The operation of both the transducer 70 and muffler 73 are well known to those familiar with the art and are omitted herein for sake of clarity. To lift the piston assembly 11 with the vacuum pressure system 68, the slide plate member 41 is located in its extreme right hand position as illustrated in FIG. 1.

When the piston assembly 11 reaches the top of the chamber assembly 21, it is held in this position by the coaction of its magnetic member 17 and the cylindrical magnet 74, FIG. 1, which fits slidably within the upper cavity 13 of piston 12. The magnet 74 is affixed to a linkage system generally indicated by the reference number 75.

More particularly, the top of magnet 74 is threadably engaged with the bottom end of a vertical cylindrical link member 76. The top end of member 76 has a small diameter bore 77. An elongated horizontal link member 78 has a ball-shaped point 79 which is seated in the bore 77. The center portion 80 of member 78 is in the shape of two base facing truncated cones so as to provide a high point 81 at their interface. The other end of the member 78 is in the shape of a horizontal cylindrical bar 82 which has a vertical opening 83. Member 78 acts as a lever with its fulcrum at point 81. The bar 80 provides a cam surface for operating the lever action of member 78.

The member 78 is located in a cylindrical tube 84. Tube 84 has an inner diameter compatible to the diameter of member 78 at the high point 81, and an outer diameter compatible to the bore 38 of member 34 in which it is located. Tube 84 also has a slot 85 aligned with the slot 39 of member 33 and which is of compatible dimensions. Tube 84 also has a pair of aligned holes 86, which are in vertical alignment with the hole 83 of member 78 and the holes 40 of member 34. A pin 87 extends vertically through the holes 40, 83, 86 and confines the movement of the lever 78 in the vertical plane.

A cam roller 88, which is rotatable about roller shaft 89, extends through the aligned slots 39, 85 in coacting relationship with the cam surface bar 82. The shaft 89 is mounted between the two sides of a U-shaped member 90 which is affixed in the opening 44 of slide plate member 41.

Link member 76 is vertically and slidably mounted in a cylindrical shaped sleeve member 91 and more particularly in the concentric cylindrical collar 92 of member 91 through which it passes. Member 91 fits within the opening formed by the recesses 29, 30 of member 27 and the recesses 35, 36 of member 34. The outside diameter of the main body of member 91 is compatible with the diameters of recesses 30 and 35. The recess 36 of member 34 is compatibly contoured with the contour of the flange 93 of member 91. A circular hole or opening 94 is provided in the side of sleeve member 91 to allow extension and passage of the tube 84 therethrough. Additional holes 95, only two of which are viewable in FIG. 1, are provided in the side of member 91 for connecting the particular pressure system inside the member 91 to the recess 29 of member 27 and hence to the piston assembly 11. Small vent holes 96, only two of which are viewable in FIG. 1, are provided in the bottom 97 of member 91 to allow an additional air path to piston assembly 11. A clearance space 97 between the top of the magnet 74 and the bottom 97 of the sleeve 91 is provided to allow the vertical movement of the magnet 74.

Slide plate member 41 is driven by an air cylinder 99 which has its piston rod or shaft 100 in threadable engagement with the member 41. The cylinder 99 is connected by flexible tubing or hoses 101, 102 to a pneumatic actuator system, not shown, which in turn bidirectionally drives the piston rod 100.

Mounted on the side member 23 of chamber assembly 21 are two pneumatic transducer electrical switches 103, 104 which sense the pressure in the chamber assembly 21 to provide control signals indicative of the position of piston assembly 11 in the chamber assembly 21.

The chamber assembly extends through a central opening 105 in a rectangular platform member 106. Base plate member 27 is supported on four stand-off cylindrical legs 107, only two of which are viewable in FIG. 1. Legs 107 are attached to the members 27 and 106 by bolts 108 which are in threaded engagement with the tops and bottoms of legs 107. In turn, plate member 106 is supported by four frame legs 109, only two of which are viewable in FIG. 1, by the bolts 110 which are in threaded engagement with the legs 109. Four removable transparent safety side covers 111-114 are affixed to the sides of the platform member 106.

Beneath platform 106 is a carriage transport system, generally indicated by the reference number 115. Preferably, the system 115 supports and positions the ceramic substrate S and the multiple pins P loaded in the holes H thereof and which pins P are to be affixed to the substrate S. As is apparent to those skilled in the art, system 115 is adjusted to position the pin loaded substrate S in the X, Y and Z directions so that the pinning area of the substrate S is centered beneath the chamber assembly 21. By way of example and for sake of explanation, the system 115 is shown schematically in FIG. 1 as having a table 116 which is slidably mounted on a pair of parallel guide bars 117, 118 aligned in the X direction, and a removable ceramic pinning die fixture 119 which is affixable to the table 116. In the illustrated system 115, it should be understood that an appropriate size access opening, not shown, is provided in the cover 111, through which the guide bars 117, 118 extend outwardly so as to permit the table 116 to be positioned external of the apparatus 10 and thus facilitate the loading and unloading of the fixture 119, and substrate S, as well as the insertion of the pins P to be affixed, as will next be described.

In a preferred mode of operation of the apparatus 10, a blank cured ceramic substrate S with multiple preformed holes H is mounted on the fixture 119. The elongated metallic P pins to be affixed to the substrate S are inserted in the holes H such that they extend from the bottom side of substrate S into correspondingly aligned holes 120 of fixture 119 and protrude a uniform distance slightly above the top of substrate S. The loaded fixture 119, is then mounted on the table 116 which at this time is accessible located on the left hand side of cover 111 as viewed facing FIG. 1. Any suitable means as is apparent to those skilled in the art, may be used to affix the substrate S to the fixture 119 and to affix fixture 119 to the table 116, and as such are omitted herein for sake of clarity. Table 116 is then positioned so that the pinning area of the substrate S is centered under the assembly 21 in appropriate X, Y and Z alignment as aforementioned.

Initially, the slide plate member 41 of shuttle valve assembly 33 is in its extreme right hand position as shown in FIG. 1, vacuum port 42 being in communication with the inner cylindrical opening of member 91. As such, the vacuum pressure system 68 is operative through the vacuum port 42, and high pressure port 43 is blocked by stationary members 34 and 45. Piston assembly 11 is thus in the up position as illustrated in FIG. 1, herein after sometimes referred to as the upper or first position, and is being held thereat by the attractive magnetic force of the magnet 74 exerted on the magnetic member 17 which places it in contact therewith. As such, the magnet 74 is being held in its illustrated lower position by the linkage system 75, the vertical link member 76 and horizontal link member 78 being in their respective illustrated lower and substantially horizontal positions. At this time, the pressure in the chamber assembly 21 beneath the piston assembly 11 is at atmospheric or a reduced pressure. Consequently, the transducer switches 103, 104 sense this condition and provide control signals indicative of this condition. These control signals may be used to indicate the status of the apparatus 10, i.e. that the slide plate member 41 is in its aforementioned right hand position, the piston assembly 11 is in its up position, and/or therefore the apparatus 10 is ready for the pinning operation.

Thereafter, air cylinder 99 is actuated through line or hose 102 by opening an electrically operated valve, not shown, connected thereto. As a result, the air cylinder piston, not shown, and hence piston shaft 100 and slide plate member 41 are moved from their illustrated extreme right hand positions to their extreme left hand positions, not shown. In the left hand position, the high pressure port 43 is in axial alignment with the funnel shaped bore 46 of plate member 45 and the inner cylindrical opening of sleeve member 91. The vacuum port 42 on the other hand is blocked by stationary members 34 and 45.

The piston assembly 11 is prevented from being released prematurely before the high pressure system can become stabilized in the inner cylindrical opening of sleeve 91 and through its other openings 95, 96 as the slide member 41 moves from right to left and carries the port 43 over the sleeve member 91. More particularly, the magnet 74 is maintained in its illustrated down position with the piston assembly 11, through its member 17, upheld thereby until substantially the end of the stroke of piston 100 whereupon the cam roller 88 which is being carried by the slide member 41 comes in contact with the inclined face of the center portion 80 of lever member 78 causing member 78 to pivot clockwise as viewed facing FIG. 1. As a result, the magnet 74 is lifted up by the linkage assembly 75 and comes in contact with bottom of sleeve member 91. As the magnet 74 is being lifted, the magnetic attractive force between it and the member 17 is broken and the air pressure from accumulator 59 impels the piston assembly 11 down the chamber assembly 21 with the air bearings 19 providing uniform lateral support therebetween.

As a result, the impact plate member 15 impacts the top of the pins P, hereafter sometimes referred to as the lower or second position of the piston assembly 11, and places them in a viscoelastic fluid state as hereinafter explained. As a result of the delayed release of the piston assembly 11, the air in bearings 19 are also stabilized so that the assembly 11 rides smoothly in the chamber assembly 21 when it is subsequently released. With assembly 11 in its lower position, the pressure transducer switches 103, 104 now senses the high pressure system in the chamber assembly 21. Their resultant control signals may then be decoded to indicate that the slide plate member 41 is now in its left hand position, the piston assembly 11 is in lower position, and/or therefore the pinning operation has been performed.

To lift, i.e., return, the piston assembly 11 from its lower position to its upper position in chamber assembly 21, the slide plate member 41 is moved, i.e., returned, from its left hand position to its illustrated right hand position. More particularly, air pressure is fed to line 101 by an electrically operated valve, not shown, which causes the air cylinder piston shaft 100 and consequently the member 41 to move to the right. As the plate member 41 initially moves to the right, cam roller 42 rides off the inclined surface of center portion 80 of member 78. Gravity and/or the high pressure system 48 causes magnet 74 to return to its illustrated down position. In response thereto, the link member 78 returns to its horizontal position as it pivots counterclockwise about point 81, and is maintained in the horizontal position by the contact between roller 88 and its horizontal bar 82. As the piston shaft 100 approaches the end of its return stroke, the high pressure port 43 is completely blocked by members 34 and 45, and the vacuum port 42 is placed in communication with the inner cylinder opening of sleeve member 91. This results in the lifting of the piston assembly 11 in the chamber assembly 21 to the illustrated upper position where it is then held in place by the magnetic attraction of magnet 74 on the member 17.

The mass of piston assembly 11, and its impact speed, and the length of chamber assembly 21 and because of the piston stroke are judiciously selected and/or adjusted relative to the number of multiple pins P to be pinned in the substrate, the respective diameter dimensions of the pins P and the holes H, and the thickness dimension of the substrate, so as to provide an impact force which is sufficient to place the pins P in the desired viscoelastic fluid state and effect a flow thereof between the ceramic particles of the substrate S in the regions surrounding the respective holes H. The flow forms an integral extension in each of the pins P, when the pin P and the fluid flow return to its solid undisturbed state, that is in an interlocking engaged relationship with the ceramic particles, of the particles region surrounding the hole H which the particular pin is located. The apparatus 10 thus prevents and/or mitigates cracking of the brittle substrate S and provides a jig-saw puzzle-like conformal fit between the pins P and the ceramic particles surrounding the holes H, and provides a substantial fill of the holes H. For a better understanding of the interlocking engaged relationships thereof, reference should be made to the aforementioned copending application, Ser. No. 223,190, incorporated herein by reference, and in particular FIG. 3 thereof.

By way of example, a typical piston assembly 11 has the following nominal parameters, to wit: a weight of approximately 0.20 pounds, a fixed stroke of five inches, and an outer cross-sectional square area of 2.25 square inches. In Table I below is indicated typical air pressures in the accumulator tank 49, from which the speeds of piston assembly 11 and hence the impact forces can be calculated as is apparent to those skilled in the art, that produce the aforementioned viscoelastic fluid flow and resultant extensions and interlocking engaged relationships for ceramics substrates of a nominal thickness of 0.06 inches with preformed holes of nominal diameters of 0.0225 inches to which copper pin blanks of nominal diameters of 0.0220 are to be affixed within the substrate holes. By way of information, the pin blanks are approximately 0.290 inches long and protrude above the upper surface of the substrate when located in the aligned holes of the substrate and fixture 119 approximately 0.058 inches. Table I correlates the pressure required in the accumulator 49 for the number of pins which are to be simultaneously impacted, the pin count being shown in multiples of ten in Table I, which can be interpolated for other pin count numbers.

TABLE I

| Pin Count | Pressure (PSI) |
| --- | --- |
| 0 | 0.0 |
| 10 | 0.7 |
| 20 | 1.5 |
| 30 | 2.2 |
| 40 | 2.9 |
| 50 | 3.7 |
| 60 | 4.4 |
| 70 | 5.1 |
| 80 | 5.9 |
| 90 | 6.6 |
| 100 | 7.3 |
| 110 | 8.1 |
| 120 | 8.8 |
| 130 | 9.6 |
| 140 | 10.3 |
| 150 | 11.0 |
| 160 | 11.8 |
| 170 | 12.5 |
| 180 | 13.2 |
| 190 | 13.9 |
| 200 | 14.6 |

The attractive force of the magnet 74 is judiciously selected to be greater than the maximum piston assembly driving force of the apparatus 10 required by the user.

The air bearing system 19, which is operatively effective during the downstroke of piston assembly 11, is not critical for the upstroke of assembly 11 and consequently a vacuum pressure system is preferrably used in the embodiment of FIGS. 1 and 2. However, as is apparent to those skilled in the art, alternatively the apparatus 10 may be modified to use a positive air pressure system for lifting the piston assembly and/or such that the air bearings 19 are operative during the lifting of the piston assembly 11.

Moreover, while the piston assembly 11 and chamber assembly 21 have preferrably a square cross-sectional configuration, other cross-sectional configurations such as circular may be utilized as is well known to those skilled in the art. Likewise, while a permanent magnet 74 and linkage system 75 combination is used in the preferred embodiment, the inventions can be practiced with an electromagnet that is electrically operated to provide the attraction force and/or release of the assembly 11 as is also apparent to those skilled in the art.

Thus, while the invention has been particularly shown and described wih reference to a preferred embodiment thereof, it will be understood by those skilled in the art that various changes in form and details may be made therein without departing from the spirit and scope of the invention.

We claim:

1. Machine apparatus for pinning plural metallic pins to a cured substrate of ceramic particles, said pins being located in respective pre-formed openings of said substrate prior to being pinned thereto, said apparatus comprising:

tube-like chamber means,
   piston means slidably operable in said chamber means in first and second opposite direction,
   a magnetizable member affixed to said piston means,
   pneumatic first means for driving said piston means in said first direction within said chamber means and away from a predetermined first position, said piston means simultaneously impacting said plural pins at a predetermined second position when being driven in said first direction,
   pneumatic second means for returning said piston means in said second direction within said chamber means away from said second position and to said first position,
   selective valve means for selectively interconnecting said first and second pneumatic member means to said chamber means,
   air bearing means for laterally supporting said piston means relative to said chamber means at least during the movement of said piston means within said chamber means between said first and second positions,
   said piston means impacting said pins with a predetermined impact force that places said pins in a temporary viscoelastic fluid state causing each of said pins to flow between said particles of said substrate in the region surrounding the particular hole in which each said pin is located, said fluid flow forming an integral extension in each of said pins in interlocking engaged relationship with the ceramic particles of said substrate region surrounding the particular hole in which each said pin is located upon return of each said pin and said fluid flow to its undisturbed solid state, and
   delay means for delaying release of said piston means from said first position to said second position until said air pressure from said pneumatic first means becomes stabilized in said chamber means and in said air bearing means,
   said delay means further comprising:
   a permanent magnet maintaining said piston means in said first position by a magnetic force of attraction of said magnetizable member thereto, and
   release means for interrupting said magnetic force of attraction when said air pressure from said pneumatic first means becomes stabilized in said chamber means.

2. Machine apparatus according to claim 1 wherein said release means comprises a linkage system connected to said magnet and said selective valve means.

3. Apparatus according to claim 2 wherein said valve means comprises a shuttle valve assembly having a slidable plate member and a cam roller rotable affixed thereto, said linkage system further having a cam operated link member in contact with said roller.

4. Apparatus according to claim 3 wherein said link member further has a lever portion for moving said magnet toward and away from said magnetizable member.

* * * * *